(12) United States Patent
Kuthi et al.

(10) Patent No.: US 10,586,688 B2
(45) Date of Patent: Mar. 10, 2020

(54) INDUCTIVE CURRENT SENSOR ON PRINTED CIRCUIT BOARD

(71) Applicant: Lam Research Corporation, Fremont, CA (US)

(72) Inventors: Andras Kuthi, Thousand Oaks, CA (US); Shen Peng, Dublin, CA (US); Jimmy Nguyen, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 425 days.

(21) Appl. No.: 15/419,986

(22) Filed: Jan. 30, 2017

(65) Prior Publication Data

US 2018/0217185 A1    Aug. 2, 2018

(51) Int. Cl.
*H01J 37/32*      (2006.01)
*H05K 1/02*      (2006.01)
(Continued)

(52) U.S. Cl.
CPC ...... *H01J 37/32917* (2013.01); *G01R 15/181* (2013.01); *G01R 21/01* (2013.01); *H05K 1/0243* (2013.01); *H05K 1/181* (2013.01); *H01F 27/2804* (2013.01); *H01J 37/3211* (2013.01); *H01J 37/32091* (2013.01); *H01J 37/32183* (2013.01); *H05K 2201/10022* (2013.01); *H05K 2201/10151* (2013.01)

(58) Field of Classification Search
CPC ...... G01R 15/04; G01R 15/14; G01R 15/142; G01R 15/144; G01R 15/146; G01R 15/148; G01R 15/16; G01R 15/165; G01R 15/18; G01R 15/181; G01R 15/185; G01R 19/0038; G01R 19/0084; G01R 19/0092; G01R 23/00; G01R 23/005; G01R 23/02; G01R 29/0807; G01R 33/02; G01R 33/32; H01F 27/2804; H01F 27/2871; H01F 37/321; H01F 37/3211
USPC .......... 216/59, 61, 68; 324/76.13, 76.17, 96, 324/117 R, 127, 260, 261, 263, 126; 336/200, 232; 427/8, 569; 156/345

See application file for complete search history.

(56) References Cited

U.S. PATENT DOCUMENTS 4,767,996 A * 8/1988 Jinzenji .................. G01R 31/02
                                                                                            324/522
5,652,506 A * 7/1997 Sorenson ................. G01R 1/22
                                                                                           324/117 R (Continued)

*Primary Examiner* — Steven L Yeninas
(74) *Attorney, Agent, or Firm* — Penilla IP, APC

(57) ABSTRACT

A first inductive loop is formed within a printed circuit board (PCB). The PCB is mounted in a fixed spatial relationship with a radiofrequency power supply structure. A second inductive loop is formed within the PCB. The second inductive loop is positioned in fixed spatial relationship with the first inductive loop such that a distance between the centerpoints of the first and second inductive loops has a fixed value and is precisely known. Each of the first and second inductive loops is formed in an essentially identical manner with regard to number of complete turns of the loops and a size of the loops. A first voltage signal present on the first inductive loop and a second voltage signal present on the second inductive loop and the distance between the first and second loops provide for determination of a radiofrequency current present on the radiofrequency power supply structure.

18 Claims, 7 Drawing Sheets

(51) Int. Cl.
   *H05K 1/18*     (2006.01)
   *G01R 21/01*    (2006.01)
   *G01R 15/18*    (2006.01)
   *H01F 27/28*    (2006.01)

(56) References Cited

U.S. PATENT DOCUMENTS

| | | | |
|---|---|---|---|
| 9,664,710 B2* | 5/2017 | Roberson | G01R 15/142 |
| 9,958,480 B2* | 5/2018 | Nejatali | G01R 19/0092 |
| 2003/0205557 A1* | 11/2003 | Benjamin | H01J 37/321 |
| | | | 216/59 |
| 2006/0113987 A1* | 6/2006 | Sorensen | G01R 15/148 |
| | | | 324/117 H |
| 2011/0108194 A1* | 5/2011 | Yoshioka | H01J 37/321 |
| | | | 156/345.35 |
| 2012/0145322 A1* | 6/2012 | Gushiken | H01J 37/321 |
| | | | 156/345.28 |
| 2015/0112621 A1* | 4/2015 | Matsumoto | G01R 15/06 |
| | | | 702/64 |
| 2016/0131682 A1* | 5/2016 | Scholz | G01R 15/181 |
| | | | 324/127 |
| 2016/0231364 A1* | 8/2016 | Nejatali | G01R 19/0092 |
| 2017/0006667 A1* | 1/2017 | Falcon | G01R 15/181 |
| 2018/0019053 A1* | 1/2018 | Ichikawa | H01F 38/30 |

* cited by examiner data $\quad v = v_{27}\sin(\omega_{27} t - \varphi_{27}) + v_2\sin(\omega_2 t - \varphi_2)$
synthetic fit $\quad v_{27}=40\text{mV} \quad\quad v_2=6.6\text{mV}$ $\varphi_{27}=82\text{deg} \quad\quad \varphi_2=97\text{deg}$ data $\quad i = i_{27}\sin(\omega_{27} t - \varphi_{27}) + i_2\sin(\omega_2 t - \varphi_2)$
synthetic fit $\quad i_{27}=65\text{mV} \quad\quad i_2=2.3\text{mV}$ $\varphi_{27}=26\text{deg} \quad\quad \varphi_2=-24\text{deg}$

```
                                                    ┌─ 601
┌──────────────────────────────────────────────────────────┐
│ Electrically connecting a voltage measurement circuit between a radiofrequency
│ power supply structure and an output terminal, the voltage measurement circuit
│ including a first capacitor electrically connected between the radiofrequency power
│ supply structure and an internal node of the voltage measurement circuit, the
│ voltage measurement circuit including a first resistor electrically connected
│ between the internal node and the output terminal, the voltage measurement circuit
│ including a second capacitor electrically connected between the internal node and
│ a reference ground potential, the voltage measurement circuit including a second
│ resistor electrically connected between the internal node and the reference ground
│ potential, the first capacitor having a lower capacitance value than the second
│ capacitor, the first resistor providing a reverse cable termination resistance, and
│ the second resistor providing a direct current restoration resistance.
└──────────────────────────────────────────────────────────┘
                              │
                              ▼                      ┌─ 603
┌──────────────────────────────────────────────────────────┐
│ Transmit radiofrequency signals through the radiofrequency power supply
│                             structure.
└──────────────────────────────────────────────────────────┘
                              │
                              ▼                      ┌─ 605
┌──────────────────────────────────────────────────────────┐
│     Sample voltage values present at the output terminal over a period of time.
└──────────────────────────────────────────────────────────┘
                              │
                              ▼                      ┌─ 607
┌──────────────────────────────────────────────────────────┐
│      Fit a sinusoidal function to the voltage values sampled at the output terminal.
└──────────────────────────────────────────────────────────┘
                              │
                              ▼                      ┌─ 609
┌──────────────────────────────────────────────────────────┐
│   Determine a root mean square voltage at the output terminal based on the
│                            sinusoidal function.
└──────────────────────────────────────────────────────────┘
                              │
                              ▼                      ┌─ 611
┌──────────────────────────────────────────────────────────┐
│                  Determine a frequency of the sinusoidal function.
└──────────────────────────────────────────────────────────┘
                              │
                              ▼                      ┌─ 613
┌──────────────────────────────────────────────────────────┐
│ Evaluate a transfer function to determine the radiofrequency voltage on the
│ radiofrequency power supply structure, the transfer function using the determined
│ root mean square voltage at the output terminal and the determined frequency of
│ the sinusoidal function and a capacitance value of the first capacitor and a
│ capacitance value of the second capacitor and a resistance value of the first
│                                  resistor.
└──────────────────────────────────────────────────────────┘
```

Fig. 6

INDUCTIVE CURRENT SENSOR ON PRINTED CIRCUIT BOARD

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency of the RF power applied, and magnitude of the RF power applied, among others. Therefore, it is of interest to understand, monitor, and/or control some of the process parameters that may affect the characteristics of the generated plasma, particularly with regard to delivery of the RF power to the plasma generation region. It is within this context that the present invention arises.

SUMMARY

In an example embodiment, an inductive current sensor is disclosed. The inductive current sensor includes a printed circuit board configured for mounting in a fixed spatial relationship with a radiofrequency power supply structure. The inductive current sensor also includes a first inductive loop formed of a conductive material within the printed circuit board. The first inductive loop has a number of complete turns. Each of the number of complete turns of the first inductive loop has a width measured in a first direction and a length measured in a second direction. The second direction is perpendicular to the first direction. Each of the number of complete turns of the first inductive loop circumscribes an area of the first inductive loop. The inductive current sensor also includes a second inductive loop formed of the conductive material within the printed circuit board. The second inductive loop has the same number of complete turns as the first inductive loop. Each of the number of complete turns of the second inductive loop also has the same width as measured in the first direction and the same length as measured in the second direction as the first inductive loop. Each of the number of complete turns of the second inductive loop circumscribes an area of the second inductive loop that is equal to the area of the first inductive loop. The area of the first inductive loop has a centerpoint, and the area of the second inductive loop has a centerpoint. The second inductive loop is positioned in fixed spatial relationship with the first inductive loop such that a distance as measured in the first direction between the centerpoint of the area of the first inductive loop and the centerpoint of the area of the second inductive loop has a fixed value, and such that a reference line oriented perpendicular to the radiofrequency power supply structure extends through both the centerpoint of the area of the first inductive loop and the centerpoint of the area of the second inductive loop. The inductive current sensor also includes a first output terminal electrically connected to the first inductive loop to enable measurement of a first voltage signal present on the first inductive loop. The inductive current sensor also includes a second output terminal electrically connected to the second inductive loop to enable measurement of a second voltage signal present on the second inductive loop. The first voltage signal present on the first inductive loop and the second voltage signal present on the second inductive loop and the distance as measured in the first direction between the centerpoint of the area of the first inductive loop and the centerpoint of the area of the second inductive loop provide for determination of a radiofrequency current present on the radiofrequency power supply structure.

In an example embodiment, a method is disclosed for inductive determination of radiofrequency current on a radiofrequency power supply structure. The method includes transmitting radiofrequency signals through the radiofrequency power supply structure. The method also includes measuring a voltage on a first inductive loop positioned in a fixed spatial relationship with the radiofrequency power supply structure. The first inductive loop has a number of complete turns. Each of the number of complete turns of the first inductive loop has a width measured in a first direction and a length measured in a second direction, where the second direction is perpendicular to the first direction. Each of the number of complete turns of the first inductive loop circumscribes an area of the first inductive loop. The area of the first inductive loop has a centerpoint. The method also includes measuring a voltage on a second inductive loop positioned in a fixed spatial relationship with the first inductive loop. The second inductive loop has the same number of complete turns as the first inductive loop. Each of the number of complete turns of the second inductive loop has the same width as measured in the first direction and the same length as measured in the second direction as the first inductive loop. Each of the number of complete turns of the second inductive loop circumscribes an area of the second inductive loop. The area of the second inductive loop is equal to the area of the first inductive loop. The area of the second inductive loop has a centerpoint. The second inductive loop is positioned in the fixed spatial relationship with the first inductive loop such that a distance as measured in the first direction between the centerpoint of the area of the first inductive loop and the centerpoint of the area of the second inductive loop has a fixed value, and such that a reference line oriented perpendicular to the radiofrequency power supply structure extends through both the centerpoint of the area of the first inductive loop and the centerpoint of the area of the second inductive loop. The method also includes determining the radiofrequency current on the radiofrequency power supply structure by evaluating a transfer function using the measured voltage on the first inductive loop and the measured voltage on the second inductive loop and the distance as measured in the first direction between the centerpoint of the area of the first inductive loop and the centerpoint of the area of the second inductive loop.

In an example embodiment, a method is disclosed for measuring radiofrequency voltage on a radiofrequency power supply structure. The method includes electrically connecting a voltage measurement circuit between the radiofrequency power supply structure and an output terminal. The voltage measurement circuit includes a first capacitor electrically connected between the radiofrequency power supply structure and an internal node of the voltage measurement circuit. The voltage measurement circuit includes a first resistor electrically connected between the internal node and the output terminal. The voltage measurement circuit includes a second capacitor electrically connected between the internal node and a reference ground potential. The voltage measurement circuit includes a second resistor electrically connected between the internal node and the reference ground potential. The first capacitor has a lower capacitance value than the second capacitor. The first resistor provides a reverse cable termination resistance. The second resistor provides a direct current restoration resistance. The method also includes transmitting radiofrequency signals through the radiofrequency power supply structure. The method also includes sampling voltage values present at the output terminal over a period of time. The method also includes fitting a sinusoidal function to the voltage values sampled at the output terminal. The method also includes determining a root mean square voltage at the output terminal based on the sinusoidal function. The method also includes determining a frequency of the sinusoidal function. The method also includes evaluating a transfer function to determine the radiofrequency voltage on the radiofrequency power supply structure. The transfer function uses the determined root mean square voltage at the output terminal and the determined frequency of the sinusoidal function and a capacitance value of the first capacitor and a capacitance value of the second capacitor and a resistance value of the first resistor.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 6 shows a flowchart of a method for measuring radiofrequency voltage on a radiofrequency power supply structure, in accordance with some embodiments of the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
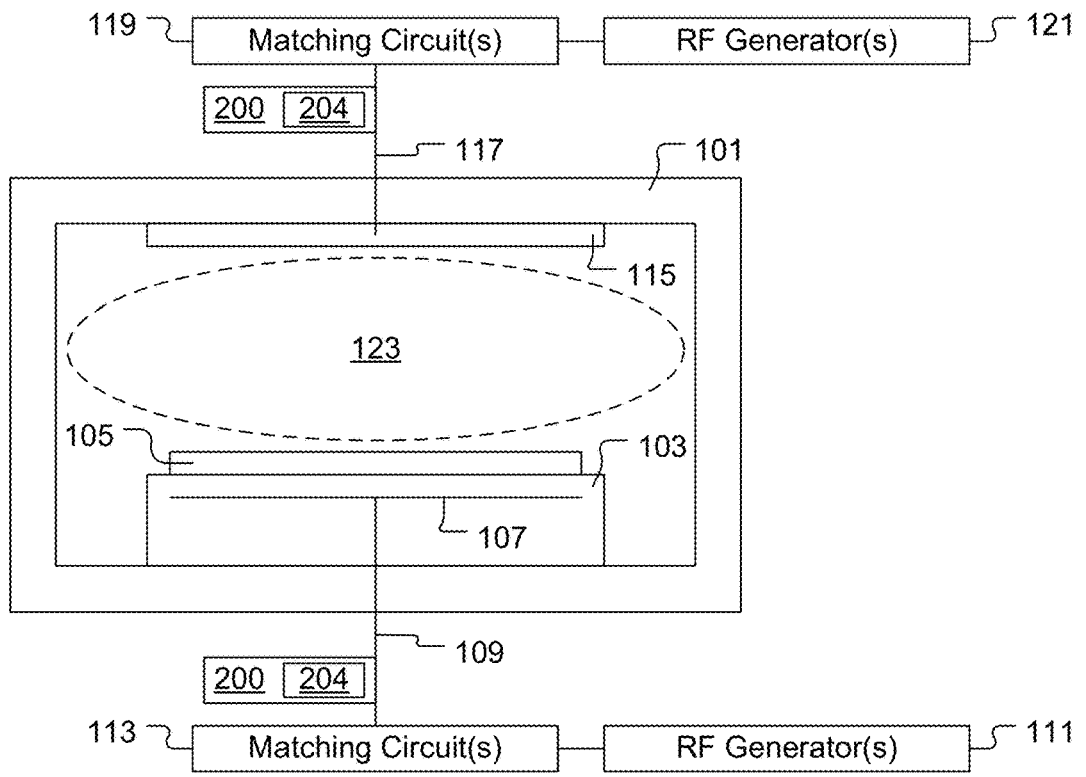
FIG. 1A shows an example vertical cross-section diagram of a CCP processing chamber, in accordance with some embodiments of the present invention.

In the semiconductor industry, semiconductor substrates can undergo fabrication operations in various types of plasma chambers, such as capacitively coupled plasma (CCP) processing chamber and inductively coupled plasma (ICP) plasma processing chambers. FIG. 1A shows an example vertical cross-section diagram of a CCP processing chamber 101, in accordance with some embodiments of the present invention. The CCP processing chamber 101 defines a processing volume within which a plasma 123 is generated in exposure to a substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material 105 present on the substrate 105.

In some embodiments, the substrate 105 is a semiconductor wafer undergoing a fabrication procedure. However, it should be understood that in various embodiments, the substrate 105 can be essentially any type of substrate that is subjected to a plasma-based fabrication process. For example, in some embodiments, the term substrate 105 as used herein can refer to substrates formed of sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 referred to herein may correspond to a 200 mm (millimeters) semiconductor wafer, a 300 mm semiconductor wafer, or a 450 mm semiconductor wafer. Also, in some embodiments, the substrate 105 referred to herein may correspond to a non-circular substrate, such as a rectangular substrate for a flat panel display, or the like, among other shapes.

In various embodiments, the CCP processing chamber 101 operates by flowing one or more process gases into the processing volume, and by applying radiofrequency power to the one or more process gases to transform the one or more process gases into the plasma 123 in exposure to the substrate 105, in order to affect a change in material or surface condition on the substrate 105. The CCP processing chamber 101 includes a substrate support structure 103 upon which the substrate 105 is positioned and supported during processing operations. In some embodiments, an electrode 107 is disposed within the substrate support structure 103 to provide for transmission of radiofrequency power from the electrode 107 through the processing volume to generate the plasma 123. The electrode 107 is connected to receive radiofrequency power through a radiofrequency power supply structure 109, which is connected to one or more radiofrequency signal generator(s) 111 by way of one or more impedance matching circuit(s) 113. The matching circuit(s) 113 include an arrangement of capacitors and/or inductors configured to ensure that an impedance seen by the radiofrequency signal generator(s) 111 at the radiofrequency power supply structure 109 is sufficiently close to a load impedance for which the radiofrequency signal generator(s) 111 is designed to operate, so that radiofrequency signals generated and transmitted by the radiofrequency signal generator(s) 111 will be transmitted into the processing volume in an efficient manner, i.e., without unacceptable reflection.

Also, in some embodiments, an upper electrode 115 can also be provided. In various embodiments, the upper electrode 115 can provide either an electrical ground electrode or can be used to transmit radiofrequency power into the processing volume. In some embodiments, the upper electrode 115 is connected to receive radiofrequency power through a radiofrequency power supply structure 117, which is connected to one or more radiofrequency signal generator(s) 121 by way of one or more impedance matching circuit(s) 119. The matching circuit(s) 119 include an arrangement of capacitors and/or inductors configured to ensure that an impedance seen by the radiofrequency signal generator(s) 121 at the radiofrequency power supply structure 117 is sufficiently close to a load impedance for which the radiofrequency signal generator(s) 121 is designed to operate, so that radiofrequency signals generated and transmitted by the radiofrequency signal generator(s) 121 will be transmitted into the processing volume in an efficient manner, i.e., without unacceptable reflection.

Figure 1B:
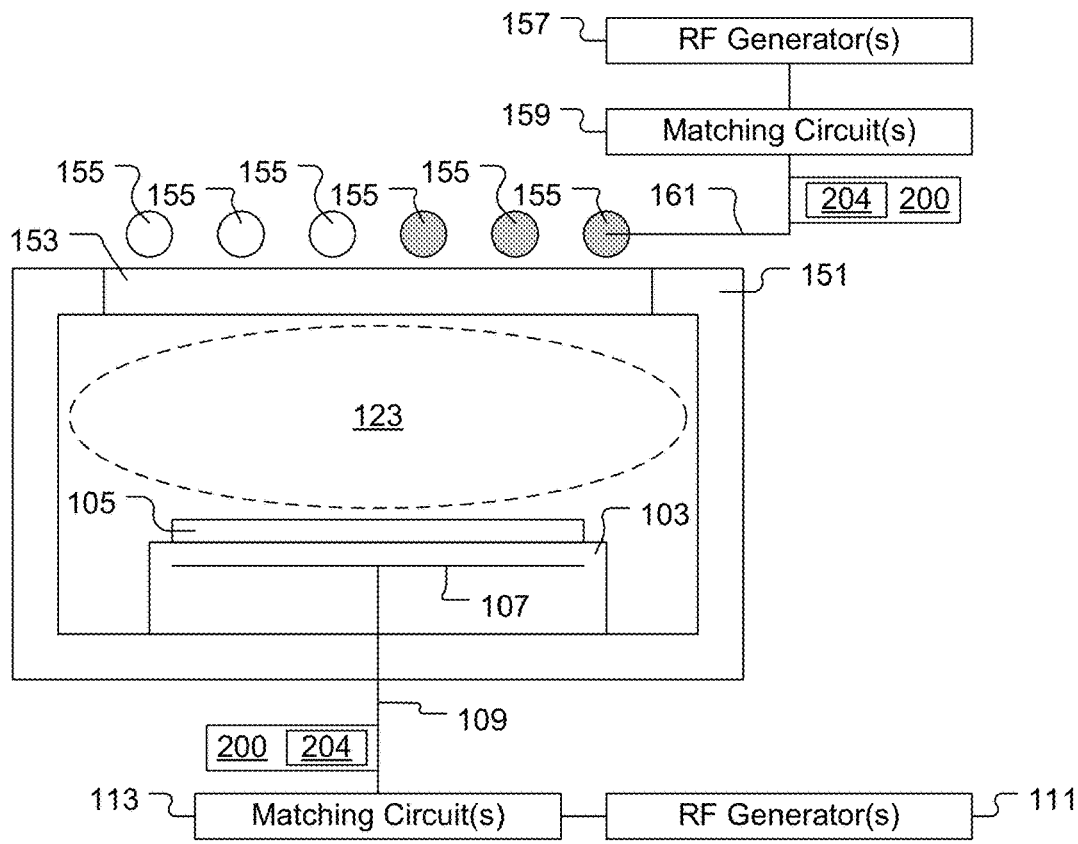
FIG. 1B shows an example vertical cross-section diagram of an ICP processing chamber, in accordance with some embodiments of the present invention.

FIG. 1B shows an example vertical cross-section diagram of an ICP processing chamber 151, in accordance with some embodiments of the present invention. The ICP processing chamber can also be referred to as a transformer coupled plasma (TCP) processing chamber. For ease of discussion herein, ICP processing chamber will be used to refer to both ICP and TCP processing chambers.

The ICP processing chamber 151 defines a processing volume within which the plasma 123 is generated in exposure to the substrate 105 to affect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material 105 present on the substrate 105.

It should be understood that the ICP processing chamber 150 can be any type of ICP processing chamber in which radiofrequency signals are transmitted from a coil 155 disposed outside the ICP processing chamber 151 to a process gas within the ICP processing chamber 151 to generate the plasma 123 within the ICP processing chamber 151. An upper window structure 153 is provided to allow for transmission of radiofrequency signals from the coil 155 through the upper window structure 153 and into the processing volume of the ICP processing chamber 151. The ICP processing chamber 150 operates by flowing one or more process gases into the processing volume, and by applying radiofrequency power from the coil 155 to the one or more process gases to transform the one or more process gases into the plasma 123 in exposure to the substrate 105, in order to affect a change in material or surface condition on the substrate 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can be of essentially any configuration that is suitable for transmitting radiofrequency power through the upper window structure 153 and into the plasma processing volume. In various embodiments, the coil 155 can have any number of turns and any cross-section size and shape (circular, oval, rectangular, trapezoidal, etc.) as required to provide the necessary transmission of radiofrequency signals through the upper window structure 153 into the processing volume.

The coil 155 is connected through a radiofrequency power supply structure 161 to one or more radiofrequency signal generator(s) 157 by way of one or more matching circuit(s) 159. The matching circuit(s) 159 includes an arrangement of capacitors and/or inductors configured to ensure that an impedance seen by the radiofrequency signal generator(s) 157 at the coil 155 is sufficiently close to a load impedance for which the radiofrequency signal generator(s) 157 is designed to operate, so that radiofrequency signals supplied to the coil 155 by the primary radiofrequency signal generator(s) 157 will be transmitted into the processing volume in an efficient manner, i.e., without unacceptable reflection. Also, in some embodiments, the ICP processing chamber 151 can include the electrode 107, the radiofrequency power supply structure 109, the matching circuits(s) 113, and the radiofrequency signal generator(s) 111, as previously described with regard to FIG. 1A.

Each of FIGS. 1A and 1B shows an inductive current sensor 204 formed within a printed circuit board (PCB) 200 that is mounted to the radiofrequency power supply structures 109, 117, 161. The inductive current sensor 204 is defined to provide for measurement of the true radiofrequency current ($I_{RF}$) present on the radiofrequency power supply structure to which the PCB 200 is mounted. The inductive current sensor 204 is also defined to provide for measurement of the true radiofrequency voltage ($V_{RF}$) present on the radiofrequency power supply structure to which the PCB 200 is mounted. And, in turn, the inductive current sensor 204 is defined to provide for measurement of the true radiofrequency power ($P_{RF}$) transmitted through the radiofrequency power supply structure to which the PCB 200 is mounted. It should be understood that the PCB 200 can be mounted to any radiofrequency supply structure, e.g., 109, 117, 161, for which measurement of the radiofrequency current, voltage, and power is desired.

Figure 2A:
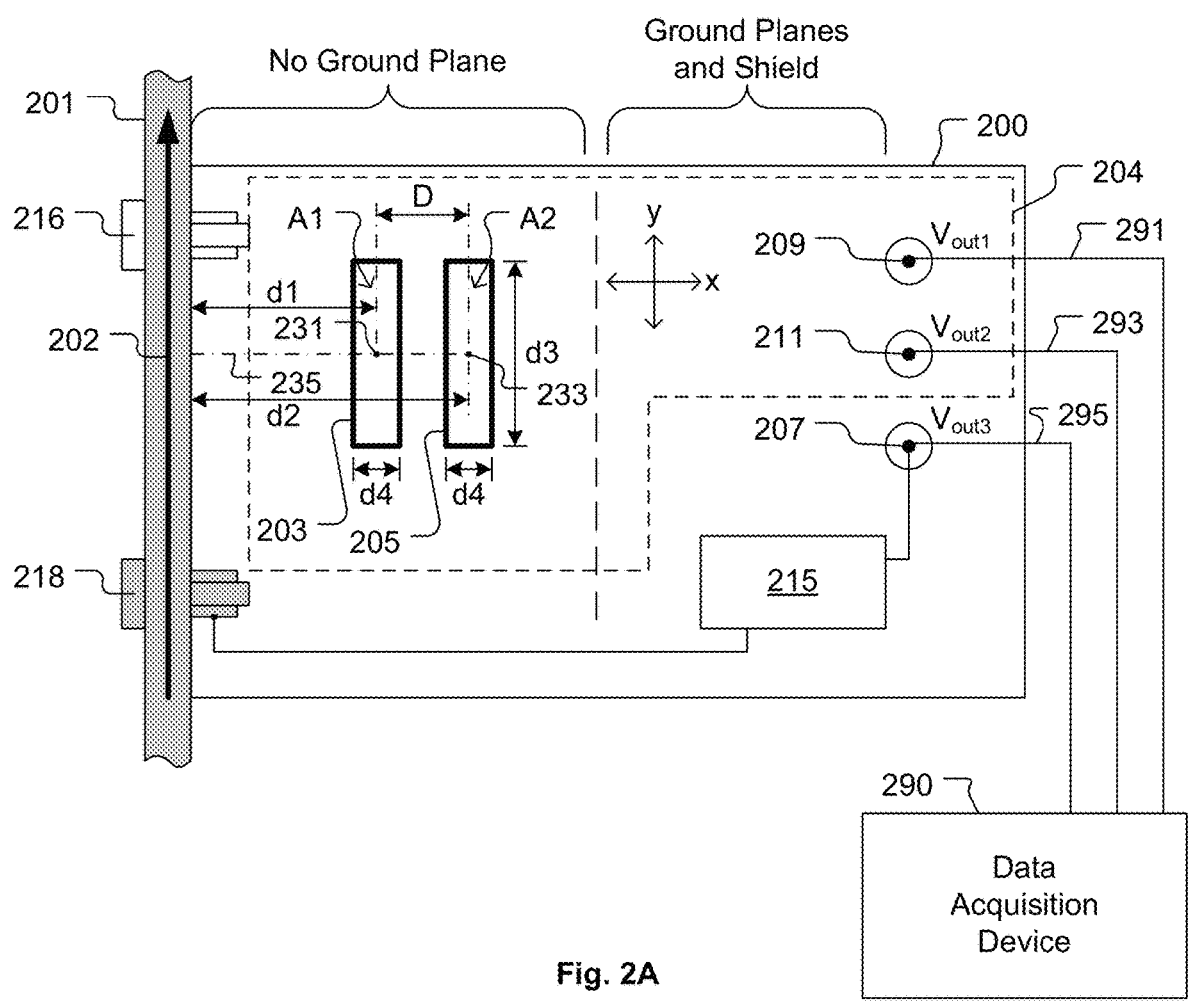
FIG. 2A shows a diagram of the PCB within which an inductive current sensor is formed, in accordance with some embodiments of the present invention.

FIG. 2A shows a diagram of the PCB 200 within which an inductive current sensor 204 is formed, in accordance with some embodiments of the present invention. The PCB 200 is configured for mounting in a fixed spatial relationship with the radiofrequency power supply structure 201. It should be understood that the PCB 200 can be mounted as an add-on to the radiofrequency power supply structure 201 without breaking or interrupting or perturbing a pre-existing radiofrequency current path through the radiofrequency power supply structure 201. The mounting of the PCB 200 relative to the radiofrequency power supply structure 201 not only avoids having to break the radiofrequency current path, but also does not require high precision and exact reproducibility. This is because the design of the inductive current sensor 204 formed within the PCB 200 controls the resolution and precision of the radiofrequency current measurement without regard to how precisely the PCB 200 is positioned relative to the radiofrequency power supply structure 201.

In some embodiments, the PCB 200 is connected to the radiofrequency power supply structure 201 using a number of fasteners 216, 218, such as bolts or the like. For example, in some embodiments, the number of fasteners 216, 218 can extend through the radiofrequency power supply structure 201 to connect with a respective receiving component rigidly fixed to the PCB 200. And, in some embodiments, the PCB 200 can be connected to the radiofrequency power supply structure 201 using a clamping device that secures to the radiofrequency power supply structure 201 without requiring any fastener 216, 218 to extend through the radiofrequency power supply structure 201. It should be understood that in various embodiments the radiofrequency power supply structure 201 can have different physical configurations. For example, in various embodiments, the radiofrequency power supply structure 201 can have a plate configuration or a cylindrical configuration, among others.

Also, it should be understood that some of the fasteners 216, 218 and/or clamping device, if present, can be formed of dielectric material to avoid interfering with the electromagnetic field emanating from the radiofrequency power supply structure 201. And, some of the fasteners 216, 218 and/or clamping device, if present, can be formed of electrically conductive material to enable direct electrical connection of a desired circuit on the PCB 200 to the radiofrequency power supply structure 201. In the example of FIG. 2A, the fastener 216 is formed of dielectric material. And, the fastener 218 is formed of electrically conductive material. Therefore, the fastener 216 does not interfere with the electromagnetic field emanating from the radiofrequency power supply structure 201. And, the fastener 218 serves as an electrical conductor providing for electrical connection to the radiofrequency power supply structure 201.

The inductive current sensor 204 includes a first inductive loop 203 and a second inductive loop 205. Both the first inductive loop 203 and the second inductive loop 205 are formed within the PCB 200. The first inductive loop 203 is formed of a conductive material and has a number of complete turns (n) of the conductive material. Each of the number of complete turns (n) of the first inductive loop 203 has a width (d4) measured in a first direction (x) and a length (d3) measured in a second direction (y). The second direction (y) is perpendicular to the first direction (x). Each of the number of complete turns (n) of the first inductive loop 203 circumscribes an area (A1) of the first inductive loop 203. The area (A1) of the first inductive loop 203 has a centerpoint 231.

The second inductive loop 205 is formed of the same conductive material as the first inductive loop 203. Also, the second inductive loop 205 has the same number of complete turns (n) of the conductive material as the first inductive loop 203. Each of the number of complete turns (n) of the second inductive loop 205 has the width (d4) measured in the first direction (x) and the length (d3) measured in the second direction (y). Each of the number of complete turns (n) of the second inductive loop 205 circumscribes an area (A2) of the second inductive loop 205. And, the area (A2) of the second inductive loop 205 is equal to the area (A1) of the first inductive loop 203. The area (A2) of the second inductive loop 205 has a centerpoint 233.

The second inductive loop 205 is positioned in fixed spatial relationship with the first inductive loop 203 such that a distance (D) as measured in the first direction (x) between the centerpoint 231 of the area (A1) of the first inductive loop 203 and the centerpoint 233 of the area (A2) of the second inductive loop 205 has a fixed value. It should be understood that because the first inductive loop 203 and the second inductive loop 205 are formed with high precision within the PCB 200, the distance (D) is known with high precision and is immutable to change. Also, the second inductive loop 205 is positioned in fixed spatial relationship with the first inductive loop 203 such that a reference line 235 oriented substantially perpendicular to the radiofrequency power supply structure 201 extends through both the centerpoint 231 of the area (A1) of the first inductive loop 203 and the centerpoint 233 of the area (A2) of the second inductive loop 205. Also, in some embodiments, the first inductive loop 203 and the second inductive loop 205 are oriented to have their lengths, as measured in the second direction (y), oriented substantially parallel to a direction 202 of radiofrequency current flow through the radiofrequency power supply structure 201, when the PCB 200 is mounted to the radiofrequency power supply structure 201.

The PCB 200 also includes a first output terminal 209 electrically connected to the first inductive loop 203 (through a conductive trace within the PCB 200) to enable measurement of a first voltage signal ($V_{out1}$) present on the first inductive loop 203. And, a second output terminal 211 is electrically connected to the second inductive loop 205 (through a conductive trace within the PCB 200) to enable measurement of a second voltage signal ($V_{out2}$) present on the second inductive loop 205. The first output terminal 209 is electrically connected to a data acquisition device 290, as indicated by a connection 291. The data acquisition device 290 is configured to sample the first voltage signal ($V_{out1}$) present on the first inductive loop 203. The second output terminal 211 is electrically connected to the data acquisition device 290, as indicated by a connection 293. The data acquisition device 290 is configured to sample the second voltage signal ($V_{out2}$) present on the second inductive loop 205. In some embodiments, the first output terminal 209 and the second output terminal 211 are coaxial cable terminals. However, in other embodiments, the first output terminal 209 and the second output terminal 211 can be configured to accommodate connection of other equivalent types of electrical cabling to make the connections 291 and 293. In some embodiments, each end of the connections 291 and 293 at the data acquisition device 290 is loaded with 50 Ohms to eliminate frequency depending amplitude and phase shifts in the first voltage signal ($V_{out1}$) as sampled from the first inductive loop 203 and the second voltage signal ($V_{out2}$) as sampled from the second inductive loop 205, respectively.

In some embodiments, the data acquisition device 290 is an oscilloscope configured to temporally sample different voltage signals respectively present on different input channels of the oscilloscope. However, it should be understood that in other embodiments the data acquisition device 290 can be a voltage measurement device other than an oscilloscope, so long as the data acquisition device 290 provides for adequate temporal resolution of the first voltage signal ($V_{out1}$) present on the first inductive loop 203 and the second voltage signal ($V_{out2}$) present on the second inductive loop 205. In some embodiments, a temporal resolution of the voltage sampling provided by the data acquisition device 290 is about 5 nanoseconds, i.e., a voltage data point for a given input signal to the data acquisition device 290 is sampled every 5 nanoseconds. However, in other embodiments, the temporal resolution of the data acquisition device 290 can be more or less than 5 nanoseconds, so long as the temporal resolution enables capturing of principle frequency components of the time-varying input signal.

The first voltage signal ($V_{out1}$) present on the first inductive loop 203 as sampled by the data acquisition device 290 and the second voltage signal ($V_{out2}$) present on the second inductive loop 205 as sampled by the data acquisition device 290 enable determination of the radiofrequency current ($I_{RF}$) present on the radiofrequency power supply structure 201. More specifically, the first voltage signal ($V_{out1}$) present on the first inductive loop 203, and the second voltage signal ($V_{out2}$) present on the second inductive loop 205, and the distance (D) as measured in the first direction (x) between the centerpoint 231 of the area (A1) of the first inductive loop 203 and the centerpoint 233 of the area (A2) of the second inductive loop 205 together provide for determination of the radiofrequency current ($I_{RF}$) present on the radiofrequency power supply structure 201.

As shown in FIG. 2A, the first inductive loop 203 is positioned closer to the radiofrequency power supply structure 201 than the second inductive loop 205 when the PCB 200 is mounted to the radiofrequency power supply structure 201. The region of the PCB 200 between the first inductive loop 203 and the radiofrequency power supply structure 201 is devoid of electrically conductive material when the PCB 200 is mounted to the radiofrequency power supply structure 201. Therefore, the PCB 200 does not include a ground plane within the region of the PCB 200 between the first inductive loop 203 and the radiofrequency power supply structure 201 and within the region of the PCB 200 in proximity to the first inductive loop 203 and the second inductive loop 205. Therefore, the first inductive loop 203 and the second inductive loop 205 are exposed to an unperturbed electromagnetic field emanating from the radiofrequency power supply structure 201.

The physical specifications of the first inductive loop 203 and the second inductive loop 205, i.e., the width (d4), the length (d3), and the number of complete turns (n), can vary in different embodiments. However, in a given embodiment, i.e., on a given PCB 200, the physical specifications of the first inductive loop 203 and the second inductive loop 205 are substantially equal. More specifically, on a given PCB 200, the first inductive loop 203 and the second inductive loop 205 have the same width (d4) and the same length (d3) and the same number of complete turns (n). In an example embodiment, the width (d4) is 0.5 centimeter (cm) and the length (d3) is 2 cm, such that the area (A1) of the first inductive loop 203 is 1 $cm^2$, and the area (A2) of the second inductive loop 205 is also 1 $cm^2$.

The number of complete turns (n) can be set to obtain a desired signal strength on the first inductive loop 203 and the second inductive loop 205. Increasing the number of complete turns (n) increases the signal strength on each of the first inductive loop 203 and the second inductive loop 205, but also increases the inductance of each of the first inductive loop 203 and the second inductive loop 205. In an example embodiment, the number of complete turns (n) is 4. However, in other embodiments, the number of complete turns (n) can be within a range extending from 1 to 10. And, in some embodiments, the number of complete turns (n) can exceed 10.

Also, because the electromagnetic field emanating from the radiofrequency power supply structure 201 decreases linearly in accordance with the inverse of the distance from the radiofrequency power supply structure 201, the strength of the voltage signal induced on each of the first inductive loop 203 and the second inductive loop 205 is both a function of the number of complete turns (n) and the distance between the radiofrequency power supply structure 201 and each of the first inductive loop 203 and the second inductive loop 205. In an example embodiment, a distance (d1) between the centerpoint 231 of the area (A1) of the first inductive loop 203 and the radiofrequency power supply structure 201 is about 2 cm. Also, in this embodiment, a distance (d2) between the centerpoint 233 of the area (A2) of the second inductive loop 205 and the radiofrequency power supply structure 201 is about 3 cm. The distances (d1) and (d2) relative to the radiofrequency power supply structure 201 do not need to be precisely known, so long as these distances (d1) and (d2) remain fixed, because the precision of the radiofrequency current ($I_{RF}$) measurement provided by the inductive current sensor 204 is dependent upon the precision of the distance (D) between the centerpoint 231 of the area (A1) of the first inductive loop 203 and the centerpoint 233 of the area (A2) of the second inductive loop 205. And, the precision of the distance (D) between the first inductive loop 203 and the second inductive loop 205 can be tightly controlled in accordance with the manufacturing tolerances of the PCB 200. In an example embodiment, the distance (D) between the centerpoint 231 of the area (A1) of the first inductive loop 203 and the centerpoint 233 of the area (A2) of the second inductive loop 205 is 1 cm. However, it should be understood that other embodiments can have a different distance (D) between the centerpoint 231 of the area (A1) of the first inductive loop 203 and the centerpoint 233 of the area (A2) of the second inductive loop 205, so long as that distance (D) is precisely known.

In some embodiments, each of the number of complete turns (n) of the first inductive loop 203 and each of the number of complete turns (n) of the second inductive loop 205 is formed by a trace of electrically conductive material disposed on the PCB 200. More specifically, each of the number of complete turns (n) of the first inductive loop 203 and the second inductive loop 205 can be formed by disposing a trace of conductive material within a respective layer of the PCB 200, with the dielectric material of the PCB 200 separating neighboring ones of these respective conductive layers of the PCB 200. In some embodiments, a 0.020 inch thick trace of conductive material within a given layer of the PCB 200 is used to form a single turn of the first inductive loop 203 and a single turn of the second inductive loop 205. However, it should be understood that in other embodiments the thickness of the trace of conductive material used to form the turns of the first inductive loop 203 and the second inductive loop 205 can be either less than 0.020 inch or greater than 0.020 inch.

Also, in some embodiments, adjacent ones of the number of complete turns (n) of the first inductive loop 203 are electrically connected to each other by electrically conductive via structures formed through the PCB 200. And, similarly, adjacent ones of the number of complete turns (n) of the second inductive loop 205 are electrically connected to each other by electrically conductive via structures formed through the PCB 200. In some embodiments, fabrication of the PCB 200 requires that the via structures extend through an entirety of the thickness of the PCB 200. In these embodiments, the ends of vertically adjacent turns (of a given one of the first and second inductive loops 203, 205) that are electrically connected through a given via structure are offset from the ends of the other turns that are electrically connected through another via structure, so that the via structures can be formed through the entire thickness of the PCB 200 in a spaced apart manner.

Figure 2B:
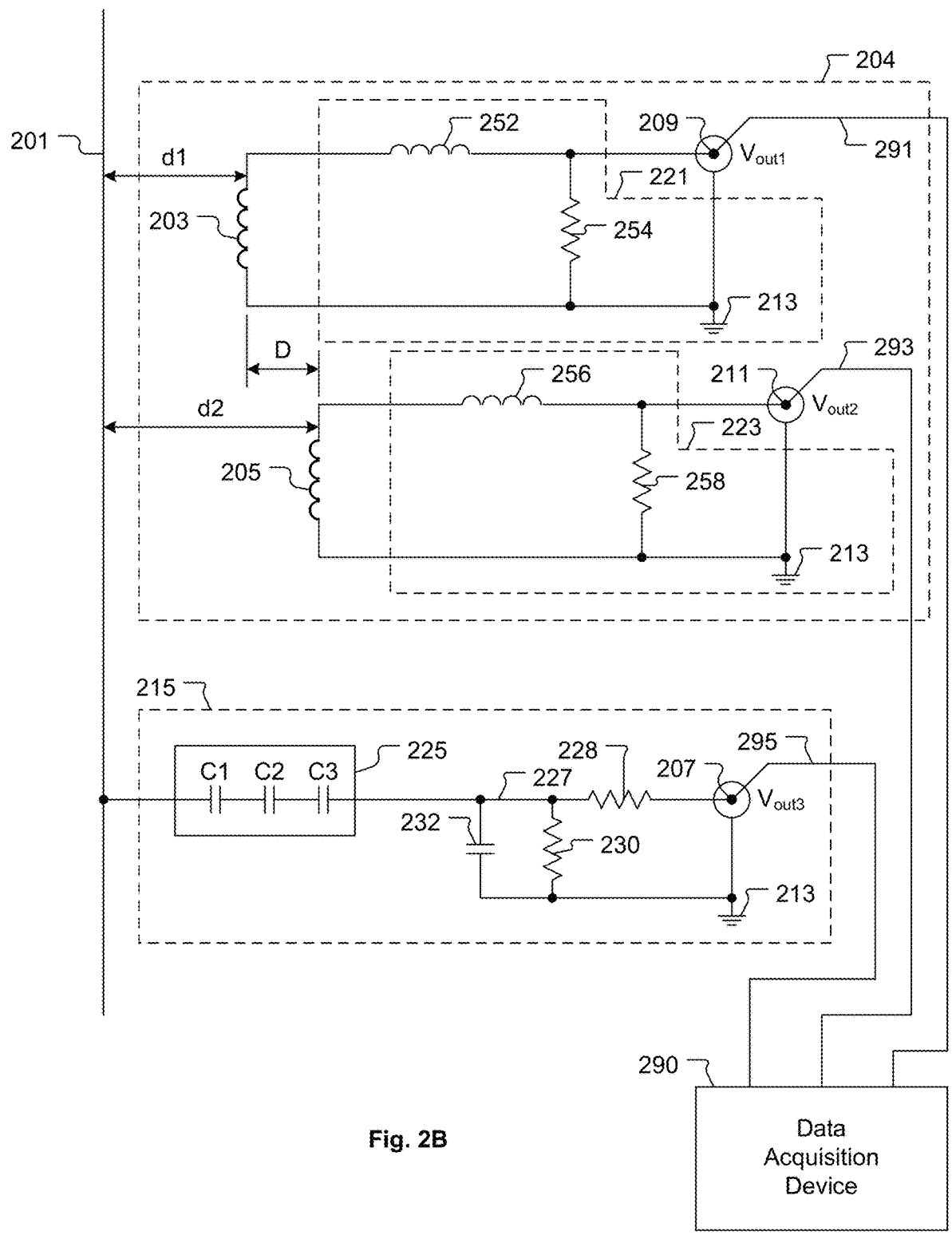
FIG. 2B shows an electrical schematic of the PCB, in accordance with some embodiments of the present invention.
Figure 2C:
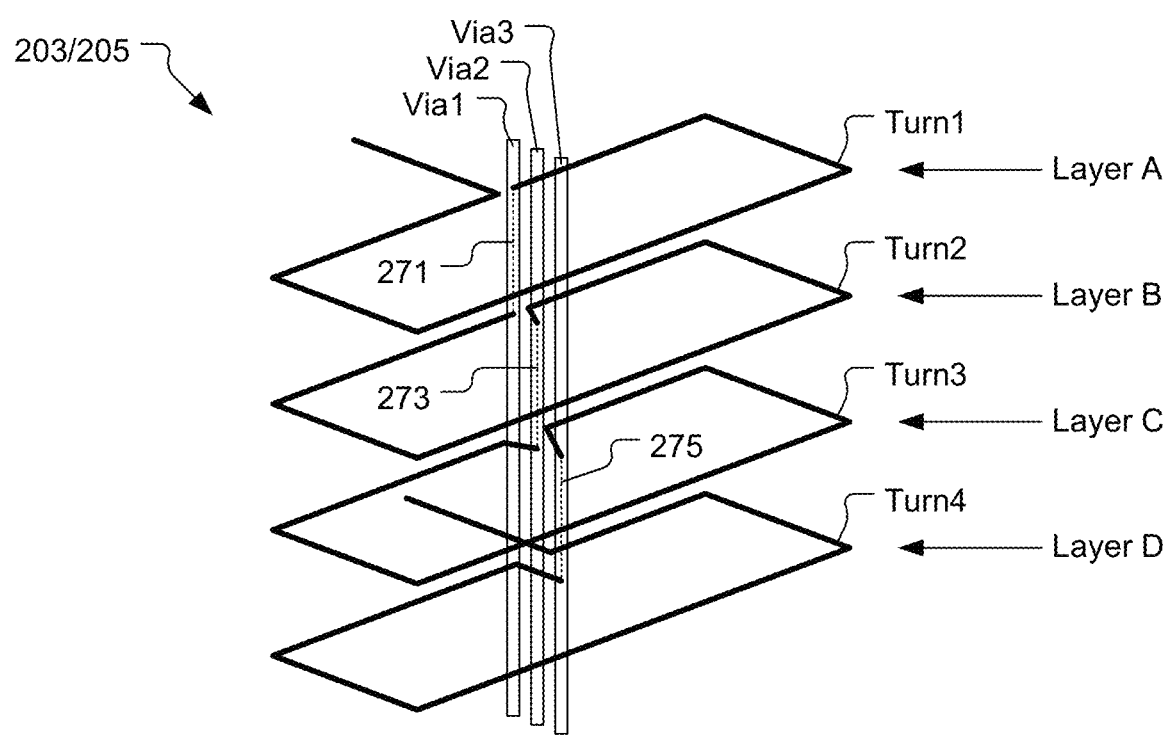
FIG. 2C shows an example of either the first inductive loop or the second inductive loop in which the number of compete turns (n) is equal to four, in accordance with an example embodiment of the present invention.

FIG. 2C shows an example of either the first inductive loop 203 or the second inductive loop 205 in which the number of compete turns (n) is equal to four, in accordance with an example embodiment of the present invention. The four turns (Turn1, Turn2, Turn3, Turn4) are respectively formed on four successive conductive layers (Layer A, Layer B, Layer C, Layer D) of the PCB 200. And, in this example embodiment, three via structures (Via1, Via2, Via3) are used to electrically connect the four turns (Turn1, Turn2, Turn3, Turn4) of the first/second inductive loop 203/205. Specifically, Via1 electrically connects vertically aligned ends of Turn1 and Turn2 as indicated by the electrically conductive section 271 of Via1. And, Via2 electrically connects vertically aligned ends of Turn2 and Turn3 as indicated by the electrically conductive section 273 of Via2. And, Via3 electrically connects vertically aligned ends of Turn3 and Turn4 as indicated by the electrically conductive section 275 of Via3. It should be understood that each of via structures (Via1, Via2, Via3) can extend vertically through an entire thickness of the PCB 200. It should also be understood that this fabrication approach, or similar, can be used to construct each of the first and second inductive loops 203, 205 on the PCB 200 with essentially any number of complete turns (n).

FIG. 2B shows an electrical schematic of the PCB 200, in accordance with some embodiments of the present invention. The inductive current sensor 204 is shown to include the first inductive loop 203 and the second inductive loop 205. The first inductive loop 203 is represented as an inductor. Similarly, the second inductive loop 205 is represented as an inductor. The inductance value of each of the first inductive loop 203 and the second inductive loop 205 is on the order of tens of nanoHenry. In an example embodiment, with the number of complete turns (n) equal to 4, the inductance value of each of the first inductive loop 203 and the second inductive loop 205 is about 60 nanoHenry.

The first inductive loop 203 is electrically connected through a first integrating circuit 221 to the first output terminal 209. The first integrating circuit 221 includes an inductor 252 electrically connected between a first end of the first inductive loop 203 and the first output terminal 209. The first integrating circuit 221 also includes a resistor 254 electrically connected between the first output terminal 209 and a reference ground potential 213. The first inductive loop 203 has a second end electrically connected to the reference ground potential 213.

Also, the second inductive loop 205 is electrically connected through a second integrating circuit 223 to the second output terminal 211. The second integrating circuit 223 includes an inductor 256 electrically connected between a first end of the second inductive loop 205 and the second output terminal 211. The second integrating circuit 223 also includes a resistor 258 electrically connected between the second output terminal 211 and the reference ground potential 213. The second inductive loop 205 has a second end electrically connected to the reference ground potential 213.

It should be understood that in some applications a radiofrequency signal of a single frequency is transmitted through the radiofrequency power supply structure 201 to achieve a desired result with regard to plasma generation within the plasma processing chamber to which the radiofrequency power supply structure 201 is connected. And, for these single-frequency applications, the first and second integrating circuits 221, 223 may not be required. However, it should also be understood that in some applications multiple radiofrequency signals of different frequencies can be simultaneously transmitted through the radiofrequency power supply structure 201 to achieve a desired result with regard to plasma generation within the plasma processing chamber to which the radiofrequency power supply structure 201 is connected. And, for these multiple-frequency applications, the first and second integrating circuits 221, 223 can be implemented to roughly equalize voltage signals that are induced on each of the first inductive loop 203 and the second inductive loop 205 by different frequencies of radiofrequency signals transmitted through the radiofrequency power supply structure 201.

For example, in some embodiments, one or more radiofrequency signals having one or more frequencies of 2 MHz, 13.56 MHz, 27 MHz, 40 MHz, and 60 MHz can be transmitted through the radiofrequency power supply structure 201 at a given time. It should also be understood, however, that in other embodiments one or more radiofrequency signals having one or more frequencies other than 2 MHz, 13.56 MHz, 27 MHz, 40 MHz, and 60 MHz can be transmitted through the radiofrequency power supply structure 201 at a given time.

The first integrating circuit 221 and the second integrating circuit 223 are configured in a substantially equivalent manner to each other so as to affect the voltage signals induced on each of the first inductive loop 203 and the second inductive loop 205 is a substantially equivalent manner. The inductor 252 of the first integrating circuit 221 and the inductor 256 of the second integrating circuit 223 have a substantially equal inductance value ($L_c$). The inductance value ($L_c$) is set such that voltage signals induced on each of the first inductive loop 203 and the second inductive loop 205, by different frequencies of radiofrequency signals simultaneously transmitted through the radiofrequency power supply structure 201, are sufficiently close in amplitude to provide for collective resolution of the voltage signals when they are analyzed together. In an example embodiment, with radiofrequency signals having frequencies of 2 MHz and 27 MHz being simultaneously transmitted through the radiofrequency power supply structure 201 at a given time, each of the inductor 252 and the inductor 256 has an inductance value ($L_c$) of 3.3 microHenry and each of the resistor 254 and the resistor 258 has a resistance value ($R_o$) of 50 Ohms.

In some embodiments, each of the inductor 252 and the inductor 256 has an inductance value ($L_c$) within a range extending from about 0.5 microHenry to about 10 microHenry. However, it should be understood that in other embodiments, the inductor 252 and the inductor 256 can have an inductance value ($L_c$) either less than about 0.5 microHenry or greater than about 10 microHenry. Also, the actual (as-manufactured) inductance value ($L_c$) of each of the inductor 252 and the inductor 256 can be separately measured (such as by using an impedance meter) and can be taken into account when analyzing the voltage signals induced on each of the first inductive loop 203 and the second inductive loop 205.

The resistor 254 of the first integrating circuit 221 and the resistor 258 of the second integrating circuit 223 have a substantially equal resistance value ($R_o$). In some embodiments, each of the resistor 254 and the resistor 258 has a resistance value ($R_o$) of about 50 Ohms. However, it should be understood that in other embodiments the resistor 254 and the resistor 258 can have a resistance value ($R_o$) either less than about 50 Ohms or greater than about 50 Ohms. Also, the actual (as-manufactured) resistance value ($R_o$) of each of the resistor 254 and the resistor 258 can be separately measured (such as by using an resistance meter) and can be taken into account when analyzing the voltage signals induced on each of the first inductive loop 203 and the second inductive loop 205.

As previously mentioned, the first voltage signal ($V_{out1}$) present on the first inductive loop 203 as sampled by the data acquisition device 290 and the second voltage signal ($V_{out2}$) present on the second inductive loop 205 as sampled by the data acquisition device 290 enable determination of the radiofrequency current ($I_{RF}$) present on the radiofrequency power supply structure 201. It should be appreciated that instead of relying on the distance from the center of a single hypothetical inductive loop to the radiofrequency power supply structure 201 to determine the radiofrequency current ($I_{RF}$) present on the radiofrequency power supply structure 201, the inductive current sensor 204 disclosed herein uses the first voltage signal ($V_{out1}$) present on the first inductive loop 203 and the second voltage signal ($V_{out2}$) present on the second inductive loop 205 and relies upon the 1/r decay of the electromagnetic field emanating from the radiofrequency power supply structure 201, where (r) is distance from the radiofrequency power supply structure 201, in conjunction with the precisely known distance (D) between the centerpoint 231 of the first inductive loops 203 and the centerpoint 233 of the second inductive loop 205, to determine the radiofrequency current ($I_{RF}$) present on the radiofrequency power supply structure 201. The precision of this approach for determining the radiofrequency current ($I_{RF}$) present on the radiofrequency power supply structure 201 depends on the precision of the voltage (and hence current) measurements on each of the first inductive loop 203 and the second inductive loop 205 and on the precision of the distance (D) as measured between the centerpoint 231 of the first inductive loop 203 and the centerpoint 233 of the second inductive loop 205. Therefore, it should be understood that the precision of the radiofrequency current ($I_{RF}$) determination enabled by the inductive current sensor 204 is not adversely influenced by any inaccuracy/imprecision in how the PCB 200 is mounted in spatial relation to the radiofrequency power supply structure 201.

The first voltage signal ($V_{out1}$) present on the first inductive loop 203 and the second voltage signal ($V_{out2}$) present on the second inductive loop 205 are processed to determine the radiofrequency current ($I_{RF}$) present on the radiofrequency power supply structure 201. More specifically, the radiofrequency current ($I_{RF}$) on the radiofrequency power supply structure 201 is determined by evaluating a transfer function, as shown in Equation 1, using a voltage (V1) determined from the sampled/measured voltage on the first inductive loop 203, and a voltage (V2) determined from the sampled/measured voltage on the second inductive loop 205, and the precisely known distance (D) as measured in the first direction (x) between the centerpoint 231 of the area (A1) of the first inductive loop 203 and the centerpoint 233 of the area (A2) of the second inductive loop 205. In this manner, the transfer function of Equation 1 accounts for the first integrating circuit 221 and the second integrating circuit 223.

$$I_{RF} = V_1 \left\{ \left[ \frac{(V_2)(D)}{V_1 - V_2} \right] \cdot \left[ \frac{\frac{2\pi(f)(L_c)}{R1} - i}{(n)(A_c)(\mu_0)(f)} \right] \right\}.$$

Equation 1

In Equation 1, ($V_1$) is the voltage determined from the sampled/measured voltage on the first inductive loop 203, and ($V_2$) is the voltage determined from the sampled/measured voltage on the second inductive loop 205, and (D) is the distance between the centerpoint 231 of the area (A1) of the first inductive loop 203 and the centerpoint 233 of the area (A2) of the second inductive loop 205, and (f) is the frequency of the sampled/measured voltages on the first and second inductive loops 203, 205, and ($L_c$) is the inductance value of the inductors 252, 256, and (R1) is one-half of the resistance value of the resistors 254, 258, and (n) is the number of complete turns of each of the first inductive loop 203 and the second inductive loop 205, and ($A_c$) is the area A1, A2 of each of the first inductive loop 203 and the second inductive loop 205, and ($\mu_0$) is the permeability of free space ($4\pi \times 10-7$ Henry/meter).

To determine the voltage ($V_1$) from the sampled/measured voltage on the first inductive loop 203, a first sinusoidal function is fit to the sampled voltage values corresponding to the first voltage signal ($V_{out1}$) present on the first inductive loop 203. In an example embodiment, with a sampling resolution of about 5 nanoseconds, the first sinusoidal function is fit to about 5 microseconds worth of sampled/measured voltage on the first inductive loop 203, which corresponds to about 1000 sampled/measured voltage data points. However, it should be understood that in various embodiments, the sampling duration of the first voltage signal ($V_{out1}$) present on the first inductive loop 203 can be either less than 5 microseconds or greater than 5 microseconds. The first sinusoidal function is analyzed to determine a root mean square voltage of the first voltage signal ($V_{out1}$) present on the first inductive loop 203, which is the voltage ($V_1$). This first sinusoidal function is also analyzed to determine the frequency ($f_1$) and a phase angle ($\varphi_1$) of the first voltage signal ($V_{out1}$) present on the first inductive loop 203. In some embodiments, the sampled voltage values corresponding to the first voltage signal ($V_{out1}$) present on the first inductive loop 203 can be transferred from the data acquisition device 290 to a computer for generation of the first sinusoidal function and evaluation of Equation 1.

Similarly, to determine the voltage ($V_2$) from the sampled/measured voltage on the second inductive loop 205, a second sinusoidal function is fit to the sampled voltage values corresponding to the second voltage signal ($V_{out2}$) present on the second inductive loop 205. Again, in an example embodiment, with a sampling resolution of about 5 nanoseconds, the second sinusoidal function is fit to about 5 microseconds worth of sampled/measured voltage on the second inductive loop 205, which corresponds to about 1000 sampled/measured voltage data points. However, it should be understood that in various embodiments, the sampling duration of the second voltage signal ($V_{out2}$) present on the second inductive loop 205 can be either less than 5 microseconds or greater than 5 microseconds. The second sinusoidal function is analyzed to determine a root mean square voltage of the second voltage signal ($V_{out2}$) present on the second inductive loop 205, which is the voltage ($V_2$). The second sinusoidal function is also analyzed to determine a frequency ($f_2$) and a phase angle ($\varphi_2$) of the second voltage signal ($V_{out2}$) present on the second inductive loop 205. In some embodiments, the sampled voltage values corresponding to the second voltage signal ($V_{out2}$) present on the first inductive loop 205 can be transferred from the data acquisition device 290 to a computer for generation of the second sinusoidal function and evaluation of Equation 1.

Figure 3:
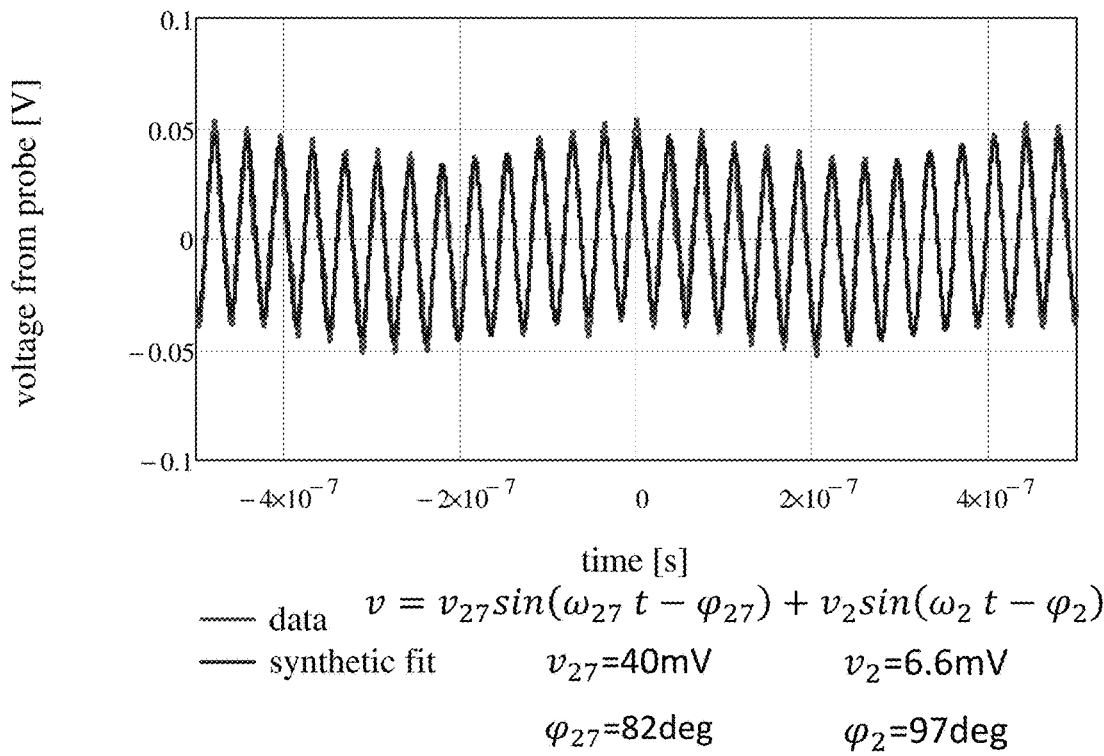
FIG. 3 shows an example sinusoidal function fit to either the first voltage signal ($V_{out1}$) sampled on the first inductive loop or the second voltage signal ($V_{out2}$) sampled on the second inductive loop, corresponding to transmission through the radiofrequency power supply structure of both a first radiofrequency signal having a frequency of 2 MHz and a power of 100 Watts and a second radiofrequency signal having a frequency of 27 MHz and a power of 500 Watts.
Figure 4:
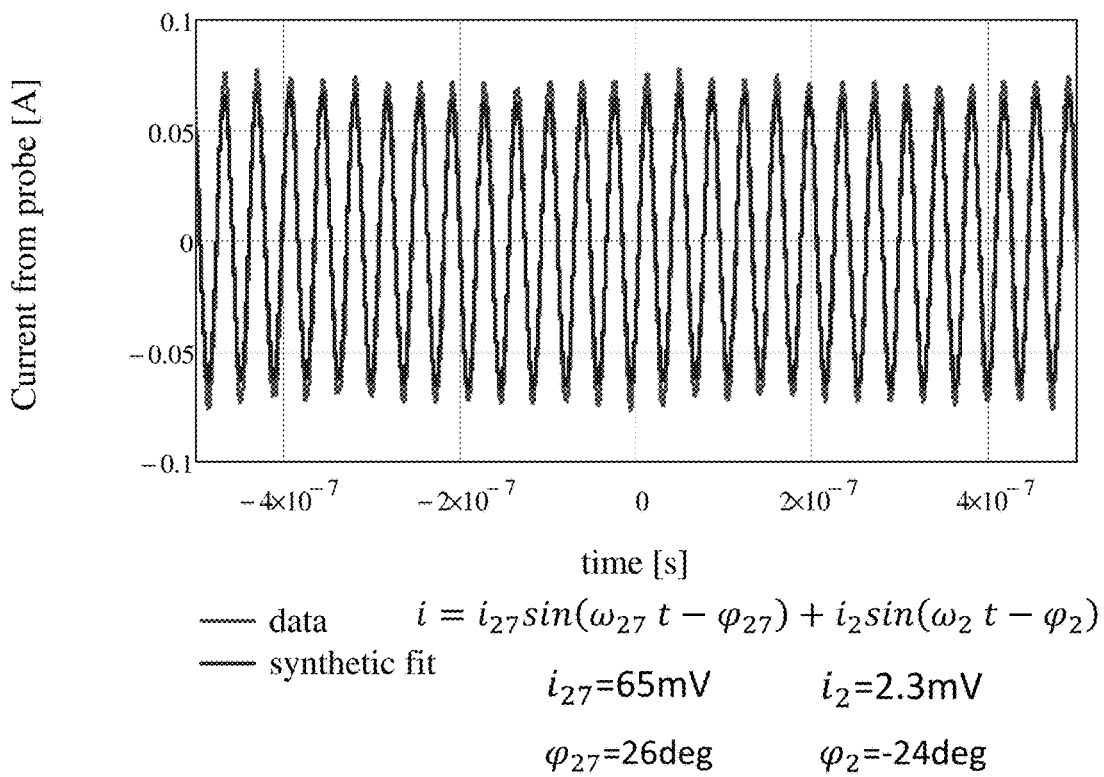
FIG. 4 shows an example current signal derived from the sinusoidal function fit to either the first voltage signal ($V_{out1}$) sampled on the first inductive loop or the second voltage signal ($V_{out2}$) sampled on the second inductive loop, corresponding to transmission through the radiofrequency power supply structure of both a first radiofrequency signal having a frequency of 2 MHz and a power of 100 Watts and a second radiofrequency signal having a frequency of 27 MHz and a power of 500 Watts.

FIG. 3 shows an example sinusoidal function fit to either the first voltage signal ($V_{out1}$) sampled on the first inductive loop 203 or the second voltage signal ($V_{out2}$) sampled on the second inductive loop 205, corresponding to transmission through the radiofrequency power supply structure 201 of both a first radiofrequency signal having a frequency of 2 MHz and a power of 100 Watts and a second radiofrequency signal having a frequency of 27 MHz and a power of 500 Watts. It should be understood that the current on the first inductive loop 203 can be determined by dividing the first voltage signal ($V_{out1}$) sampled on the first inductive loop 203 by the terminating resistance of the first inductive loop 203. Similarly, the current on the second inductive loop 205 can be determined by dividing the second voltage signal ($V_{out2}$) sampled on the second inductive loop 205 by the terminating resistance of the second inductive loop 205. FIG. 4 shows an example current signal derived from the sinusoidal function fit to either the first voltage signal ($V_{out1}$) sampled on the first inductive loop 203 or the second voltage signal ($V_{out2}$) sampled on the second inductive loop 205, corresponding to transmission through the radiofrequency power supply structure 201 of both a first radiofrequency signal having a frequency of 2 MHz and a power of 100 Watts and a second radiofrequency signal having a frequency of 27 MHz and a power of 500 Watts.

The generated sinusoidal function for the first voltage signal ($V_{out1}$) on the first inductive loop 203, such as shown in FIG. 3, can be corrected to account for the phase and amplitude shifts caused by the first inductive loop 203 and the first integrating circuit 221 to obtain a function for the voltage ($V_{RF}$) on the radiofrequency power supply structure 201. Similarly, the sinusoidal function for the current on the first inductive loop 203, such as shown in FIG. 4, can be corrected to account for the phase and amplitude shifts caused by the first inductive loop 203 and the first integrating circuit 221 to obtain a function for the current ($I_{RF}$) on the radiofrequency power supply structure 201. Then, the corrected function for the current ($I_{RF}$) on the radiofrequency power supply structure 201 can be multiplied by the corrected function for the voltage ($V_{RF}$) on the radiofrequency power supply structure 201 to get a measure of the corresponding radiofrequency power ($P_{RF}$). More specifically, the derived amplitude for a given harmonic within the corrected function for the current can be multiplied by the derived amplitude of the same harmonic within the corrected function for the voltage, and can be in turn multiplied by the cosine of the phase angle difference ($\cos(\varphi_1-\varphi_2)$) between the correction function for the current and the corrected function for the voltage, to get radiofrequency power for that particular harmonic component. And, this can be done for the various harmonic components present within the corrected functions for the current and voltage. Then, the sum of the radiofrequency powers for the various harmonic components will yield the radiofrequency power present on the radiofrequency power supply structure 201.

Also, depending on the configuration of the radiofrequency power supply structure 201, the location where the average radiofrequency current ($I_{RF-ave}$) is flowing on the radiofrequency power supply structure 201 may not be known. For example, in the case of a plate-shaped radiofrequency power supply structure 201, the radiofrequency current will flow on the surface of the plate-shaped radiofrequency power supply structure 201 and will tend to be located near the edges of the plate-shaped radiofrequency power supply structure 201, but the exact spatial distribution of the radiofrequency current may not be known. Therefore, it may not be possible to know a precise distance from the center of a single hypothetical inductive loop to a virtual location where the average radiofrequency current ($I_{RF-ave}$) is flowing on the radiofrequency power supply structure 201. However, in this regard, by using the first voltage signal ($V_{out1}$) present on the first inductive loop 203 and the second voltage signal ($V_{out2}$) present on the second inductive loop 205 and by relying upon the 1/r decay of the electromagnetic field emanating from the radiofrequency power supply structure 201, in conjunction with the precisely known distance (D) between the centerpoint 231 of the first inductive loop 203 and the centerpoint 233 of the second inductive loop 205, the inductive current sensor 204 disclosed herein provides for determination of the virtual location where the average radiofrequency current ($I_{RF-ave}$) is flowing on the radiofrequency power supply structure 201. More specifically, a distance ($D_{loop}$) between the centerpoint 231 of the first inductive loop 203 and the virtual location where the average radiofrequency current ($I_{RF-ave}$) is flowing on the radiofrequency power supply structure 201 can be determined as shown in Equation 2.

$$D_{loop} = \frac{(V_2)(D)}{V_1 - V_2}. \qquad \text{Equation 2}$$

In Equation 2, ($V_1$) is the voltage determined from the sampled/measured voltage on the first inductive loop 203, and ($V_2$) is the voltage determined from the sampled/measured voltage on the second inductive loop 205, and (D) is the distance between the centerpoint 231 of the area (A1) of the first inductive loop 203 and the centerpoint 233 of the area (A2) of the second inductive loop 205.

With reference back to FIG. 2A, in some embodiments, the PCB 200 can optionally include a voltage measurement circuit 215 electrically connected between a third output terminal 207 and the radiofrequency power supply structure 201, when the PCB 200 is mounted to the radiofrequency power supply structure 201. In some embodiments, the voltage measurement circuit 215 is electrically connected to the radiofrequency power supply structure 201 through an electrically conductive fastener 218, e.g., bolt, used to mount the PCB 200. The third output terminal 207 enables measurement of a third voltage signal ($V_{out3}$) from the voltage measurement circuit 215. As shown in FIG. 2B, the third output terminal 207 is electrically connected to the data acquisition device 290, as indicated by a connection 295. The data acquisition device 290 is configured to sample the third voltage signal ($V_{out3}$) from the voltage measurement circuit 215. In some embodiments, the third output terminal 207 is a coaxial cable terminal. However, in other embodiments, the third output terminal 207 can be configured to accommodate connection of other equivalent types of electrical cabling to make the connection 295. In some embodiments, the end of the connection 295 at the data acquisition device 290 is loaded with 50 Ohms to eliminate frequency depending amplitude and phase shifts in the third voltage signal ($V_{out3}$) as sampled from the voltage measurement circuit 215.

With reference to FIG. 2B, the voltage measurement circuit 215 includes a first capacitor 225 electrically connected between the radiofrequency power supply structure 201 (when the PCB 200 is mounted to the radiofrequency power supply structure 201) and an internal node 227 of the voltage measurement circuit 215. In various embodiments, the first capacitor 225 can be formed by any combination of capacitors. For example, in FIG. 2B, the first capacitor 225 include three capacitors C1, C2, and C3. The first capacitor 225 provides a capacitance value ($C_s$) that accounts for a high-voltage part of the voltage divider capacitance within the voltage measurement circuit 215. In an example embodiment, each of capacitors C1, C2, and C3 has a capacitance value of 5 picoFarads, which gives the first capacitor 225 the capacitance value ($C_s$) of 5/3 picoFarads.

The voltage measurement circuit 215 also includes a second capacitor 232 electrically connected between the internal node 227 and the reference ground potential 213. The second capacitor 232 provides a capacitance value ($C_p$) that accounts for a low-voltage part of the voltage divider capacitance within the voltage measurement circuit 215. The first capacitor 225 has a lower capacitance value than the second capacitor 232. In an example embodiment, the second capacitor 232 has a capacitance value ($C_p$) of 330 picoFarads, with the first capacitor 225 having the capacitance value ($C_s$) of 5/3 picoFarads.

The voltage measurement circuit 215 also includes a first resistor 228 electrically connected between the internal node 227 and the third output terminal 207. The first resistor 228 has a resistance value ($R_c$) that provides a reverse cable termination resistance. In some embodiments, the resistance value ($R_c$) of the first resistor 228 is 50 Ohms. However, in other embodiments, the resistance value ($R_c$) of the first resistor 228 can be set as needed to provide the required reverse cable termination resistance.

The voltage measurement circuit 215 also includes a second resistor 230 electrically connected between the internal node 227 and the reference ground potential 213. The second resistor 230 has a resistance value ($R_p$) that provides a direct current restoration resistance. It should be understood that the resistance value ($R_p$) of the second resistor 230 is a high resistance value. In some embodiments, the resistance value ($R_p$) of the second resistor 230 is 1000 Ohms. However, in other embodiments, the resistance value ($R_p$) of the second resistor 230 can be either greater than or less than 1000 Ohms, so long as the resistance value ($R_p$) provides the required direct current restoration resistance.

The radiofrequency voltage ($V_{RF}$) on the radiofrequency power supply structure 201 is determined by evaluating a transfer function, as shown in Equation 3, using a voltage ($V_v$) determined from the sampled/measured voltage at the third output terminal 207. The transfer function of Equation 3 accounts for the voltage measurement circuit 215.

$$V_{RF} = 2 \cdot V_v \left[ 1 + \frac{1 + i \cdot 2 \cdot \pi \cdot f_v \cdot 2 \cdot C_p \cdot R_c}{i \cdot 2 \cdot \pi \cdot f_v \cdot 2 \cdot C_s \cdot R_c} \right]. \qquad \text{Equation 3}$$

In Equation 1, ($V_v$) is the voltage determined from the sampled/measured voltage signal ($V_{out3}$) at the third output terminal 207, and ($f_v$) is the frequency of the sampled/measured voltage signal ($V_{out3}$) at the third output terminal 207, and ($C_p$) is the capacitance of the capacitor 232, and ($R_c$) is the resistance of the resistor 228, and ($C_s$) is the capacitance of the capacitor 225.

To determine the voltage ($V_v$) from the sampled/measured voltage signal ($V_{out3}$) at the third output terminal 207, a sinusoidal function is fit to the sampled voltage values corresponding to the voltage signal ($V_{out3}$). In an example embodiment, with a sampling resolution of about 5 nanoseconds, this sinusoidal function is fit to about 5 microseconds worth of sampled/measured voltage at the third output terminal 207, which corresponds to about 1000 sampled/measured voltage data points. However, it should be understood that in various embodiments, the sampling duration of the voltage signal ($V_{out3}$) present at the third output terminal 207 can be either less than 5 microseconds or greater than 5 microseconds. The sinusoidal function of the $V_{out3}$ signal is analyzed to determine a root mean square voltage of the $V_{out3}$ signal, which is the voltage ($V_v$). This sinusoidal function of the $V_{out3}$ signal is also analyzed to determine its frequency ($f_v$) and phase angle ($\varphi_v$).

In some embodiments, the sampled voltage values corresponding to the voltage signal ($V_{out3}$) present at the third output terminal 207 can be transferred from the data acquisition device 290 to a computer for generation of the first sinusoidal function and evaluation of Equation 3. Also, in some embodiments, the $V_{out3}$ signal may include some skew due to variation in the reference ground potential 213. In these embodiments, the impedance of the connector 295, e.g., coax cable, between the third output terminal 207 and the data acquisition device 290 can be modeled and corrected for in the $V_{out3}$ signal to get a corrected value for the radiofrequency voltage ($V_{RF}$) on the radiofrequency power supply structure 201 from Equation 3.

Figure 5:
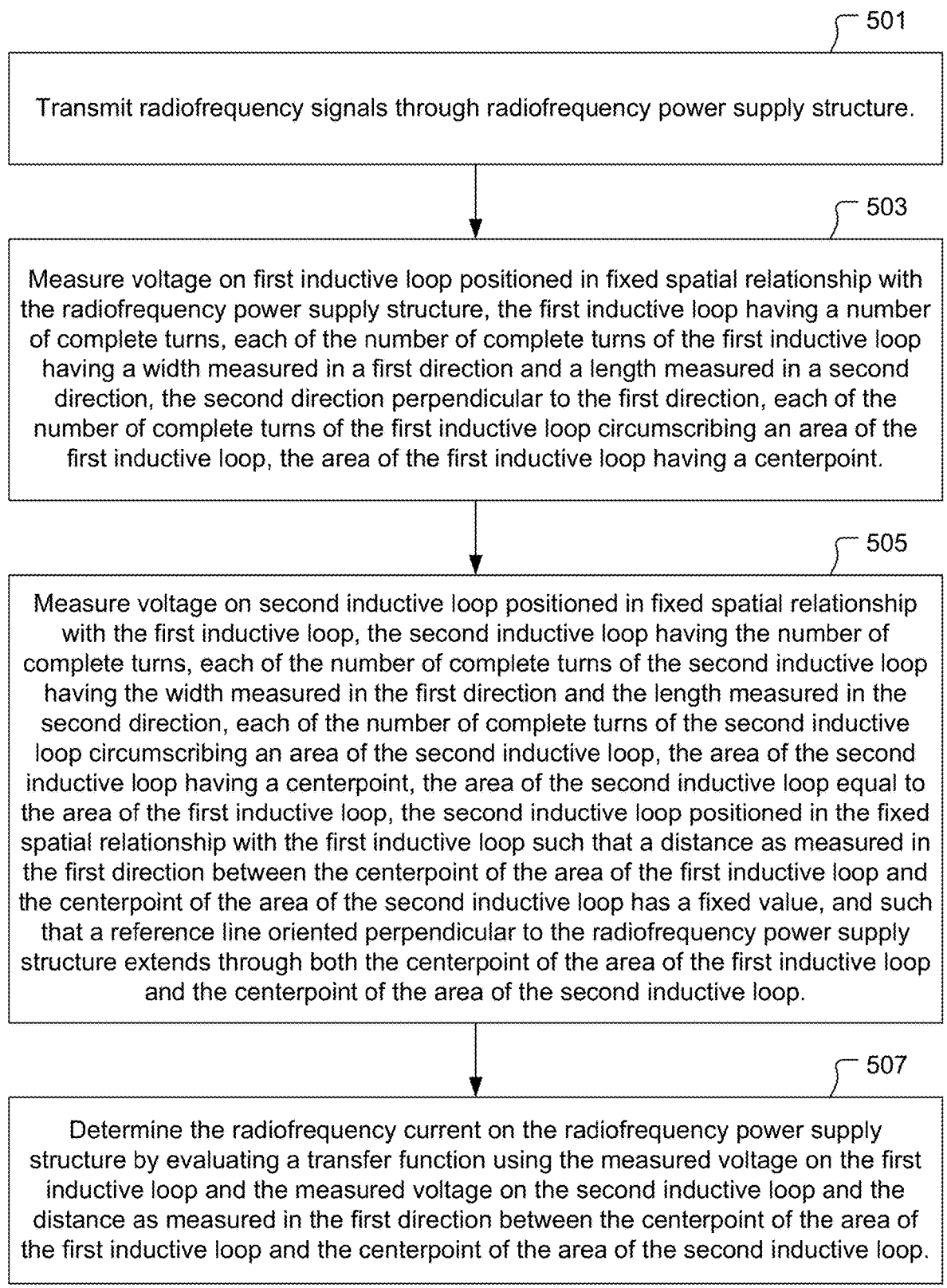
FIG. 5 shows a flowchart of a method for inductive determination of radiofrequency current on a radiofrequency power supply structure, in accordance with some embodiments of the present invention.

FIG. 5 shows a flowchart of a method for inductive determination of radiofrequency current on a radiofrequency power supply structure (201), in accordance with some embodiments of the present invention. The method includes an operation 501 for transmitting radiofrequency signals through the radiofrequency power supply structure (201). The method also includes an operation 503 for measuring a voltage on the first inductive loop (203) positioned in a fixed spatial relationship with the radiofrequency power supply structure (201). The first inductive loop (203) has the number of complete turns (n). Each of the number of complete turns (n) of the first inductive loop (203) has a width (d4) measured in the first direction (x) and a length (d3) measured in the second direction (y). The second direction (y) is perpendicular to the first direction (x). Each of the number of complete turns (n) of the first inductive loop (203) circumscribes the area (A1) of the first inductive loop (203). The area (A1) of the first inductive loop (203) has the centerpoint (231). In some embodiments, measuring the voltage on the first inductive loop (203) in operation 503 includes sampling voltage values present on the first inductive loop (203) over a period of time and fitting a first sinusoidal function to these sampled voltage values, and determining a root mean square voltage based on the first sinusoidal function. The root mean square voltage based on the first sinusoidal function gives the voltage on the first inductive loop (203).

The method also includes an operation 505 for measuring a voltage on the second inductive loop (205) positioned in a fixed spatial relationship with the first inductive loop (203). The second inductive loop (205) also has the number of complete turns (n). Each of the number of complete turns (n) of the second inductive loop (205) has the width (d4) measured in the first direction (x) and the length (d3) measured in the second direction (y). Each of the number of complete turns (n) of the second inductive loop (205) circumscribes the area (A2) of the second inductive loop (205). The area (A2) of the second inductive loop (205) has the centerpoint (233). The area (A2) of the second inductive loop (205) is equal to the area (A1) of the first inductive loop (203).

The second inductive loop (205) is positioned in the fixed spatial relationship with the first inductive loop (203) such that the distance (D) measured in the first direction (x) between the centerpoint (231) of the area (A1) of the first inductive loop (203) and the centerpoint (233) of the area (A2) of the second inductive loop (205) has a fixed value, and such that the reference line (235) oriented perpendicular to the radiofrequency power supply structure (201) extends through both the centerpoint (231) of the area (A1) of the first inductive loop (203) and the centerpoint (233) of the area (A2) of the second inductive loop (205). In some embodiments, measuring the voltage on the second inductive loop (205) in operation 505 includes sampling voltage values present on the second inductive loop (205) over a period of time and fitting a second sinusoidal function to these sampled voltage values, and determining a root mean square voltage based on the second sinusoidal function. The root mean square voltage based on the second sinusoidal function gives the voltage on the second inductive loop (205).

The method also includes an operation 507 for determining the radiofrequency current on the radiofrequency power supply structure (201) by evaluating a transfer function, such as shown in Equation 1, using the measured voltage on the first inductive loop (203) and the measured voltage on the second inductive loop (205) and the distance (D) as measured in the first direction (x) between the centerpoint (231) of the area (A1) of the first inductive loop (203) and the centerpoint (233) of the area (A2) of the second inductive loop (205). The transfer function evaluated in operation 507 accounts for a first integrating circuit (221) connected between the first inductive loop (203) and the first output terminal (209) at which the voltage on the first inductive loop (203) is measured. The transfer function evaluated in operation 507 also accounts for the second integrating circuit (223) connected between the second inductive loop (205) and the second output terminal (211) at which the voltage on the second inductive loop (205) is measured.

In some embodiments, the first integrating circuit (221) includes the first inductor (252) electrically connected between a first end of the first inductive loop (203) and the first output terminal (209). Also, the first integrating circuit (221) can include the first resistor (254) electrically connected between the first output terminal (209) and the reference ground potential (213). The first inductive loop (203) has a second end electrically connected to the reference ground potential (213). Also, in some embodiments, the second integrating circuit (223) includes the second inductor (256) electrically connected between a first end of the second inductive loop (205) and the second output terminal (211). The second integrating circuit (223) can also include the second resistor (258) electrically connected between the second output terminal (211) and the reference ground potential (213). The second inductive loop (205) has a second end electrically connected to the reference ground potential (213). Also, in some embodiments, the first inductor (252) of the first integrating circuit (221) and the second inductor (256) of the second integrating circuit 223) have the substantially equal inductance value ($L_c$). Also, in some embodiments, the first resistor (254) of the first integrating circuit (221) and the second resistor (258) of the second integrating circuit (223) have the substantially equal resistance value ($R_o$).

FIG. 6 shows a flowchart of a method for measuring radiofrequency voltage on a radiofrequency power supply structure (201), in accordance with some embodiments of the present invention. The method includes an operation 601 for electrically connecting the voltage measurement circuit (215) between the radiofrequency power supply structure (201) and the output terminal (207). The voltage measurement circuit (215) is electrically connected to the radiofrequency power supply structure (201) without disrupting an existing radiofrequency current path through the radiofrequency power supply structure (201). The voltage measurement circuit (215) includes the first capacitor (225) electrically connected between the radiofrequency power supply structure (201) and the internal node (227) of the voltage measurement circuit (215). The voltage measurement circuit (215) includes the first resistor (228) electrically connected between the internal node (227) and the output terminal (207). The voltage measurement circuit (215) includes the second capacitor (232) electrically connected between the internal node (227) and the reference ground potential (213). The voltage measurement circuit (215) includes the second resistor (230) electrically connected between the internal node (227) and the reference ground potential (213). The first capacitor (225) has a lower capacitance value than the second capacitor (232). The first resistor (228) provides a reverse cable termination resistance. The second resistor (230) provides a direct current restoration resistance.

The method also includes an operation 603 for transmitting radiofrequency signals through the radiofrequency power supply structure (201). The method also includes an operation 605 for sampling voltage values present at the output terminal (207) over a period of time. The method also includes an operation 607 for fitting a sinusoidal function to the voltage values sampled at the output terminal (207). The method also includes an operation 609 for determining a root mean square voltage at the output terminal (207) based on the sinusoidal function. The method also includes an operation 611 for determining a frequency of the sinusoidal function. The method also includes an operation 613 for evaluating a transfer function, such as shown in Equation 3, to determine the radiofrequency voltage ($V_{RF}$) on the radiofrequency power supply structure (201). The transfer function uses the determined root mean square voltage at the output terminal (207) and the determined frequency of the sinusoidal function and the capacitance value ($C_s$) of the first capacitor (225) and the capacitance value ($C_p$) of the second capacitor 232 and the resistance value ($R_c$) of the first resistor (228).

In some embodiments, the inductive current sensor 204 formed within the PCB 200 as disclosed herein can used as a replacement for self-contained voltage-current probes (V-I probes) the are currently deployed on semiconductor fabrication equipment. The extant self-contained V-I probe technology uses a toroidal-shaped current sensing structure which requires the V-I probe to be mounted to the radiofrequency power supply system in a way that necessitates breaking of the radiofrequency current path in order to accommodate the toroidal structure of current sensing structure. This breaking of the radiofrequency current path causes an impedance change that is specific to the as-fabricated state of each V-I probe and that is also specific to the installation configuration of each V-I probe. It is often necessary to know the impedance change caused by each V-I probe, because this impedance change can affect the plasma process that is being driven by the radiofrequency power. Therefore, it is often necessary to characterize the impedance change caused by each V-I probe on a unit-by-unit basis, which can be expensive and logistically difficult within the fabrication facility environment.

In contrast to the existing self-contained V-I probe technology, it should be appreciated that the inductive current sensor 204 formed within the PCB 200, as disclosed herein, does not require breaking of the radiofrequency current path. More specifically, the PCB 200 having the inductive current sensor 204 formed therein can be mounted on the radiofrequency power supply structure 201 without breaking the radiofrequency current path, and without concern regarding a precision of the mounting of the PCB 200 to the radiofrequency power supply structure 201. Because the inductive current sensor 204 uses the two inductive loops 203, 205, and because the distance (D) between the two inductive loops 203, 205 is precisely known and fixed by way of their formation within the PCB 200, the spatial relationship between the PCB 200 and the radiofrequency power supply structure 201 can vary from one installation to another without affecting the precision of the measurements provided by the inductive current sensor 204. Therefore, use of the inductive current sensor 204 within the PCB 200, as disclosed herein, eliminates measurement inaccuracy associated with other types of radiofrequency sensors and their mounting requirements and effects.

The inductive current sensor 204 within the PCB 200, as disclosed herein, can be used to measure a true radiofrequency current and a true radiofrequency voltage on the radiofrequency power supply structure 201, which in turn enables determination of a true radiofrequency power transmitted through the radiofrequency power supply structure 201. It should be understood that in some embodiments the inductive current sensor 204 within the PCB 200, as disclosed herein, can be used to measure the radiofrequency voltage and the radiofrequency current on the radiofrequency power supply structure 201 in a multi-frequency and non-50 Ohm load environment. Also, it should be understood that in some embodiments the inductive current sensor 204 within the PCB 200, as disclosed herein, can be used to compare different radiofrequency sources attached to the same processing chamber, in order to provide an efficiency comparison of the different radiofrequency sources.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. An inductive current sensor, comprising:
   a printed circuit board configured for mounting in a fixed spatial relationship with a radiofrequency power supply structure;
   a first inductive loop formed within the printed circuit board, the first inductive loop having a plurality of complete turns, each of the complete turns of the first inductive loop having a substantially same width measured in a first direction and a substantially same length measured in a second direction, the second direction perpendicular to the first direction, each of the complete turns of the first inductive loop circumscribing an area of the first inductive loop, the area of the first inductive loop having a centerpoint, the first inductive loop formed of a conductive material;
   a second inductive loop formed within the printed circuit board, the second inductive loop having a same number of complete turns as the plurality of complete turns of the first inductive loop, each of the complete turns of the second inductive loop having the substantially same width measured in the first direction and the substantially same length measured in the second direction as each of the complete turns of the first inductive loop, each of the complete turns of the second inductive loop circumscribing an area of the second inductive loop, the area of the second inductive loop having a centerpoint, the area of the second inductive loop substantially equal in size to the area of the first inductive loop, the second inductive loop formed of the conductive material,
   the second inductive loop positioned in fixed spatial relationship with the first inductive loop such that a distance as measured in the first direction between the centerpoint of the area of the first inductive loop and the centerpoint of the area of the second inductive loop has a fixed value, and such that a reference line oriented perpendicular to the radiofrequency power supply structure extends through both the centerpoint of the area of the first inductive loop and the centerpoint of the area of the second inductive loop;
   a first output terminal electrically connected to the first inductive loop to enable measurement of a first voltage signal present on the first inductive loop; and
   a second output terminal electrically connected to the second inductive loop to enable measurement of a second voltage signal present on the second inductive loop,
   wherein the first voltage signal present on the first inductive loop and the second voltage signal present on the second inductive loop and the distance as measured in the first direction between the centerpoint of the area of the first inductive loop and the centerpoint of the area of the second inductive loop provide for determination of a radiofrequency current present on the radiofrequency power supply structure.

2. The inductive current sensor as recited in claim 1, wherein the first inductive loop is positioned closer to the radiofrequency power supply structure than the second inductive loop when the printed circuit board is mounted to the radiofrequency power supply structure, and wherein the region of the printed circuit board between the first inductive loop and the radiofrequency power supply structure is devoid of electrically conductive material when the printed circuit board is mounted to the radiofrequency power supply structure.

3. The inductive current sensor as recited in claim 1, wherein a number of complete turns of each of the first inductive loop and the second inductive loop is within a range extending from 2 to 10.

4. The inductive current sensor as recited in claim 1, wherein a number of complete turns of each of the first inductive loop and the second inductive loop is 4.

5. The inductive current sensor as recited in claim 1, wherein the substantially same width measured in the first direction is 0.5 cm, and wherein the substantially same length measured in the second direction is 2 cm.

6. The inductive current sensor as recited in claim 5, wherein the distance as measured in the first direction between the centerpoint of the area of the first inductive loop and the centerpoint of the area of the second inductive loop is 1 cm.

7. The inductive current sensor as recited in claim 6, wherein the first inductive loop is positioned closer to the radiofrequency power supply structure than the second inductive loop when the printed circuit board is mounted to the radiofrequency power supply structure, and wherein a distance as measured in the first direction between the centerpoint of the area of the first inductive loop and the radiofrequency power supply structure is about 2 cm when the printed circuit board is mounted to the radiofrequency power supply structure.

8. The inductive current sensor as recited in claim 1, wherein the first inductive loop and the second inductive loop are oriented to have their substantially same lengths oriented substantially parallel to a direction of radiofrequency current flow through the radiofrequency power supply structure when the printed circuit board is mounted to the radiofrequency power supply structure.

9. The inductive current sensor as recited in claim 1, wherein each of the complete turns of the first inductive loop and each of the complete turns of the second inductive loop is formed by a corresponding trace of electrically conductive material disposed on the printed circuit board, and
   wherein adjacent ones of the complete turns of the first inductive loop are electrically connected to each other by electrically conductive via structures formed through the printed circuit board, and
   wherein adjacent ones of the complete turns of the second inductive loop are electrically connected to each other by electrically conductive via structures formed through the printed circuit board.

10. The inductive current sensor as recited in claim 1, further comprising:
   a first integrating circuit through which the first inductive loop is electrically connected to the first output terminal; and
   a second integrating circuit through which the second inductive loop is electrically connected to the second output terminal.

11. The inductive current sensor as recited in claim 10, wherein the first integrating circuit includes a first inductor electrically connected between a first end of the first inductive loop and the first output terminal, the first integrating circuit including a first resistor electrically connected between the first output terminal and a reference ground potential, the first inductive loop having a second end electrically connected to the reference ground potential,
   wherein the second integrating circuit includes a second inductor electrically connected between a first end of the second inductive loop and the second output terminal, the second integrating circuit including a second resistor electrically connected between the second output terminal and the reference ground potential, the second inductive loop having a second end electrically connected to the reference ground potential,
   wherein the first inductor and the second inductor have a substantially equal inductance value, and
   wherein the first resistor and the second resistor have a substantially equal resistance value.

12. The inductive current sensor as recited in claim 11, wherein each of the first inductor and the second inductor has an inductance value within a range extending from about 0.5 microHenry to about 10 microHenry, and
   wherein each of the first resistor and the second resistor has a resistance value of about 50 Ohms.

13. The inductive current sensor as recited in claim 1, further comprising:
   a third output terminal; and
   a voltage measurement circuit electrically connected between third output terminal and the radiofrequency power supply structure when the printed circuit board is mounted to the radiofrequency power supply structure,
   the voltage measurement circuit including a first capacitor electrically connected between the radiofrequency power supply structure when the printed circuit board is mounted to the radiofrequency power supply structure and an internal node of the voltage measurement circuit,
   the voltage measurement circuit including a first resistor electrically connected between the internal node and the third output terminal,
   the voltage measurement circuit including a second capacitor electrically connected between the internal node and a reference ground potential, and
   the voltage measurement circuit including a second resistor electrically connected between the internal node and the reference ground potential.

14. The inductive current sensor as recited in claim 13, wherein the first capacitor has a lower capacitance value than the second capacitor, and wherein the first resistor has a resistance value providing a reverse cable termination resistance, and wherein the second resistor has a resistance value providing a direct current restoration resistance.

15. A method for inductive determination of radiofrequency current on a radiofrequency power supply structure, comprising:
   transmitting radiofrequency signals through the radiofrequency power supply structure;
   measuring a voltage on a first inductive loop positioned in a fixed spatial relationship with the radiofrequency power supply structure, the first inductive loop having a plurality of complete turns, each of the complete turns of the first inductive loop having a substantially same width measured in a first direction and a substantially same length measured in a second direction, the second direction perpendicular to the first direction, each of the complete turns of the first inductive loop circumscribing an area of the first inductive loop, the area of the first inductive loop having a centerpoint;
   measuring a voltage on a second inductive loop positioned in a fixed spatial relationship with the first inductive loop, the second inductive loop having a same number of complete turns as the plurality of complete turns of the first inductive loop, each of the complete turns of the second inductive loop having the substantially same width measured in the first direction and the substantially same length measured in the second direction as each of the complete turns of the first inductive loop, each of the complete turns of the second inductive loop circumscribing an area of the second inductive loop, the area of the second inductive loop having a centerpoint, the area of the second inductive loop substantially equal in size to the area of the first inductive loop, wherein the second inductive loop is positioned in the fixed spatial relationship with the first inductive loop such that a distance as measured in the first direction between the centerpoint of the area of the first inductive loop and the centerpoint of the area of the second inductive loop has a fixed value, and such that a reference line oriented perpendicular to the radiofrequency power supply structure extends through both the centerpoint of the area of the first inductive loop and the centerpoint of the area of the second inductive loop; and
   determining the radiofrequency current on the radiofrequency power supply structure by evaluating a transfer function using the measured voltage on the first inductive loop and the measured voltage on the second inductive loop and the distance as measured in the first direction between the centerpoint of the area of the first inductive loop and the centerpoint of the area of the second inductive loop, wherein evaluation of the transfer function does not use a distance measured between the first inductive loop and the radiofrequency power supply structure.

16. The method as recited in claim 15, wherein measuring the voltage on the first inductive loop includes sampling voltage values present on the first inductive loop over a period of time and fitting a first sinusoidal function to these sampled voltage values and determining a root mean square voltage based on the first sinusoidal function, wherein the root mean square voltage based on the first sinusoidal function gives the voltage on the first inductive loop, and
wherein measuring the voltage on the second inductive loop includes sampling voltage values present on the second inductive loop over a period of time and fitting a second sinusoidal function to these sampled voltage values and determining a root mean square voltage based on the second sinusoidal function, wherein the root mean square voltage based on the second sinusoidal function gives the voltage on the second inductive loop.

17. The method as recited in claim 15, wherein the transfer function accounts for a first integrating circuit connected between the first inductive loop and a first output terminal at which the voltage on the first inductive loop is measured, and wherein the transfer function also accounts for a second integrating circuit connected between the second inductive loop and a second output terminal at which the voltage on the second inductive loop is measured.

18. The method as recited in claim 17, wherein the first integrating circuit includes a first inductor electrically connected between a first end of the first inductive loop and the first output terminal, the first integrating circuit including a first resistor electrically connected between the first output terminal and a reference ground potential, the first inductive loop having a second end electrically connected to the reference ground potential,
wherein the second integrating circuit includes a second inductor electrically connected between a first end of the second inductive loop and the second output terminal, the second integrating circuit including a second resistor electrically connected between the second output terminal and the reference ground potential, the second inductive loop having a second end electrically connected to the reference ground potential,
wherein the first inductor and the second inductor have a substantially equal inductance value, and
wherein the first resistor and the second resistor have a substantially equal resistance value.

* * * * *